(12) United States Patent
Sichert

(10) Patent No.: US 8,577,544 B2
(45) Date of Patent: Nov. 5, 2013

(54) METHOD FOR EXAMINING A STATE OF AN ELECTRIC CIRCUIT OF A MOTOR VEHICLE

(75) Inventor: Werner Sichert, Eichstätt (DE)

(73) Assignee: Audi AG, Ingolstadt (DE)

( * ) Notice: Subject to any disclaimer, the term of this patent is extended or adjusted under 35 U.S.C. 154(b) by 0 days.

(21) Appl. No.: 13/634,174

(22) PCT Filed: Mar. 8, 2011

(86) PCT No.: PCT/EP2011/001118
§ 371 (c)(1),
(2), (4) Date: Sep. 11, 2012

(87) PCT Pub. No.: WO2011/116880
PCT Pub. Date: Sep. 29, 2011

(65) Prior Publication Data
US 2013/0006466 A1    Jan. 3, 2013

(30) Foreign Application Priority Data

Mar. 20, 2010  (DE) .......................... 10 2010 012 154

(51) Int. Cl.
*G01M 17/00*    (2006.01)
*G01R 31/02*    (2006.01)

(52) U.S. Cl.
USPC ........................................ 701/31.4; 324/72.5

(58) Field of Classification Search
USPC ........... 701/31.4, 30.9, 31.7, 29.9–31.3, 32.2, 701/33.5; 324/72.5, 99 D, 263, 424, 444, 324/522, 117, 164, 713, 348–375
See application file for complete search history.

(56) References Cited

U.S. PATENT DOCUMENTS

| | | | |
|---|---|---|---|
| 3,321,754 A | | 5/1967 | Grimm |
| 4,503,389 A | * | 3/1985 | Singer ........................... 324/133 |
| 4,748,843 A | | 6/1988 | Schäfer et al. |
| 5,406,485 A | | 4/1995 | Wise et al. |
| 6,495,930 B1 | * | 12/2002 | Hermann et al. ............ 307/10.1 |
| 7,966,110 B2 | | 6/2011 | Tarchinski |
| 2011/0079494 A1 | | 4/2011 | Joswig et al. |

FOREIGN PATENT DOCUMENTS

| | | |
|---|---|---|
| DE | 35 40 599 A1 | 5/1987 |
| DE | 197 10 416 A1 | 9/1998 |
| DE | 10 2006 016 137 | 10/2007 |
| DE | 10 2008 022 840 | 10/2009 |

(Continued)

OTHER PUBLICATIONS

'Stromkreis' Wikipedia, Mar. 16, 2010.

(Continued)

*Primary Examiner* — Muhammad Shafi
(74) *Attorney, Agent, or Firm* — Henry M. Feiereisen LLC

(57) ABSTRACT

In a method for examining a state of a circuit of a motor vehicle, a state for the circuit is requested, whereafter it is checked whether the requested state is actually set. An actual value for a quantity related to the circuit is measured by a measuring unit of the motor vehicle and is compared by a control unit of the motor vehicle with values for the quantity specified for the requested state of the circuit. In parallel, corresponding steps are initiated or performed by a control unit disposed outside the motor vehicle. A message is outputted when the control unit determines that the requested state for the circuit is set. A motor vehicle using the method is also disclosed.

6 Claims, 2 Drawing Sheets

(56) References Cited

FOREIGN PATENT DOCUMENTS

| | | |
|---|---|---|
| DE | 10 2009 011261 A1 | 10/2009 |
| EP | 0 225 971 A2 | 6/1987 |
| JP | 09-318679 * | 12/1997 |

OTHER PUBLICATIONS

E. Schrüfer: Zuverlässigkeit von Mess- und Automatisierungseinrichtungen, Haser, 1984, ISBN 3-446-14190-1, Absätze 8, 8.1.

* cited by examiner

METHOD FOR EXAMINING A STATE OF AN ELECTRIC CIRCUIT OF A MOTOR VEHICLE

CROSS-REFERENCES TO RELATED APPLICATIONS

This application is the U.S. National Stage of International Application No. PCT/EP2011/001118, filed Mar. 8, 2011, which designated the United States and has been published as International Publication No. WO 2011/116880 and which claims the priority of German Patent Application, Serial No. 10 2010 012 154.1, filed Mar. 20, 2010, pursuant to 35 U.S.C. 119(a)-(d).

BACKGROUND OF THE INVENTION

The invention relates to a method for checking a state of an electric circuit of a motor vehicle and a motor vehicle with a circuit for an electrically operated engine.

Modern electric vehicles and hybrid vehicles typically have a high voltage system. When, for example, maintenance work is to be performed on the vehicle in the area of this high-voltage system, strict safety guidelines must be followed to reduce the risk of accidents.

To date, the high voltage system was therefore usually switched off first by interrupting the circuit of the high voltage system, for example, by pulling a "service plug." It must then be determined whether a voltage is still applied to the high voltage system. For this purpose, a plurality of manual measurements of the voltage in the circuit is usually performed by a service technician.

To be able to measure this voltage, it is sometimes necessary to perform complicated break-down work on the vehicle to allow the service technician to use specific measuring points. In addition, expensive, specialized measurement equipment is required. Since plugs of this measuring equipment used for measuring the voltage are repeatedly plugged into and removed from corresponding plugs of the high-voltage system of the vehicle, the respective plug wear out very quickly and must be replaced regularly at considerable expense. Another disadvantage of conventional methods is the always present risk that the service technician measures the voltage at wrong locations of the high-voltage system of the vehicle, making it impossible to derive reliable information about the condition circuit from the measured values, which may easily cause serious accidents.

It is therefore an object of the present invention to provide a method for checking the state of a circuit of a motor vehicle, which can be performed easily and in a cost-saving manner and which can reduce the risk of accidents.

This object is achieved with a method for verifying a state of an electric circuit of a motor vehicle according to claim 1 and by a motor vehicle according to claim 5.

SUMMARY OF THE INVENTION

According to the invention, the method includes the following steps:
Requesting a state of the circuit,
Measuring with at least one measurement unit of the motor vehicle a current value for at least one variable relating to the circuit, from which the state of the circuit can be derived,
Testing with at least one control unit of the motor vehicle, whether the current value for the variable corresponds to at least one predetermined value for the requested state,
Indicating that the requested state of the circuit is set when the current value for the variable corresponds to the at least one predetermined value for the variable for the requested state.

When the voltage of the circuit is measured as the variable of the circuit of the circuit, it can be easily determined whether the requested state for the circuit is actually set. Since a large number of voltage measurement devices for measuring the voltage of the high-current circuit are typically already available in electric vehicles or in hybrid vehicles, these can be used without problems.

Preferably, it is also displayed whether the state for the circuit was requested. The service technician can then observe the progress of the process based on two independent displays and thus always knows whether he has already requested the state for the circuit and needs only to wait for the autonomous check of the setting, or whether he still needs to request the status of the circuit.

Advantageously, in parallel with all of the steps of:
Measuring with the at least one measurement unit of the motor vehicle the current value for the at least one variable related to the circuit, from which the state of the circuit can be derived,
Checking with the at least one control unit of the motor vehicle, whether the current value for the variable corresponds to the at least one predetermined condition for the requested value for the variable, and
Indicating that the requested state of the circuit is set when the current value for the variable corresponds to the at least one predetermined condition for the requested value for the variable,
an additional complete step sequence is initiated or carried out by at least one additional control unit outside of the motor vehicle which includes:
Performing with the at least one measurement unit of the motor vehicle at least one additional measurement of another current value for the at least one variable related to the circuit, from which the state of the circuit can be derived,
Performing at least one additional check whether the current value for the variable corresponds to at least one predetermined value for the variable, and
Performing a further indication that the requested state of the circuit is set when the current value for the variable corresponds to the at least one predetermined value for the variable for the requested state.

This further reduces the risk of accidents, for example, during maintenance work on the high-voltage system of the vehicle. Mutually independent measurements of the variable related to the circuit are initiated by independent control devices. These devices check based on the values—also independent from one another—whether the requested state for the circuit is actually set.

A motor vehicle according to the invention includes at least one electric circuit and at least one measuring unit for measuring a variable related to the circuit. The motor vehicle also includes means for requesting a condition of a state for the circuit and at least one control unit. These are configured to:
receive from the measuring unit at least one current value for the variable of the circuit,
check whether the current value corresponds to at least one value for the variable that is predetermined for the requested state, and
indicate that the requested condition is set for the circuit, when the current value for the variable of the circuit corresponds to the at least one predetermined value for the variable of the circuit.

This allows a reduction of the costs and time required, for example, for maintenance and the like on a high-voltage system of the vehicle as well as a reduction of the risk of accidents.

Preferably, the motor vehicle includes means for exchanging data with a control unit outside the vehicle. These means allow, independent of the control unit of the motor vehicle, to
- measure with the measuring unit of the motor vehicle at least one additional current value for the variable related to of the circuit,
- test whether this additional current value corresponds to at least one value for the variable predetermined for the set state,
- indicate that the state for the circuit is set when the current value for the variable related to the circuit corresponds to the at least one predetermined value for the variable related to the circuit.

This further increases the safety for a service technician during maintenance work, because several independent measurements are initiated and tests are carried out by independent controllers.

Measurement logs and/or the predetermined values can be readily stored in memory when the at least one control unit includes a memory for storing measurement values and/or the predetermined values.

BRIEF DESCRIPTION OF THE DRAWING

A preferred embodiment of the present invention will now be described with reference to the drawing, wherein.

DETAILED DESCRIPTION OF PREFERRED EMBODIMENTS

Figure 1:
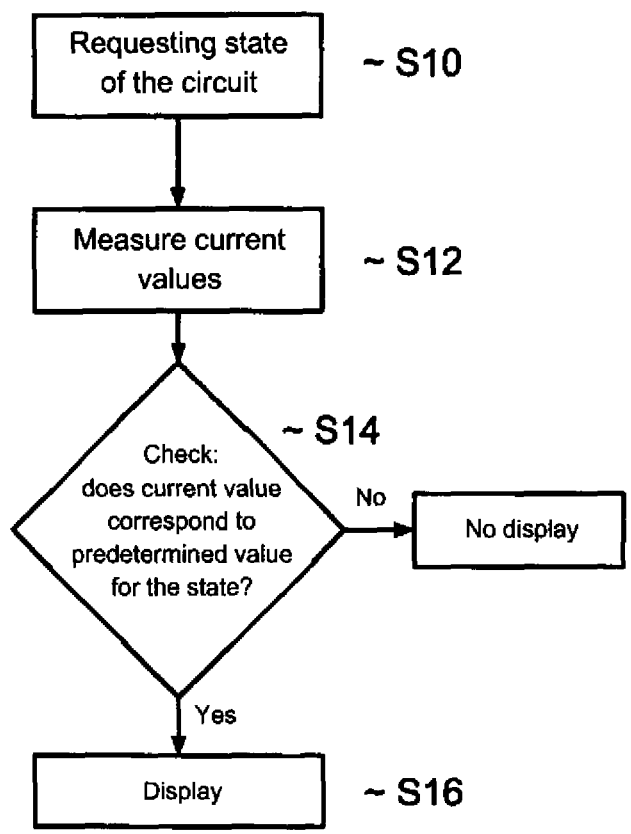
FIG. 1 illustrates schematically the sequence of steps of the method according to the present invention.
Figure 2:
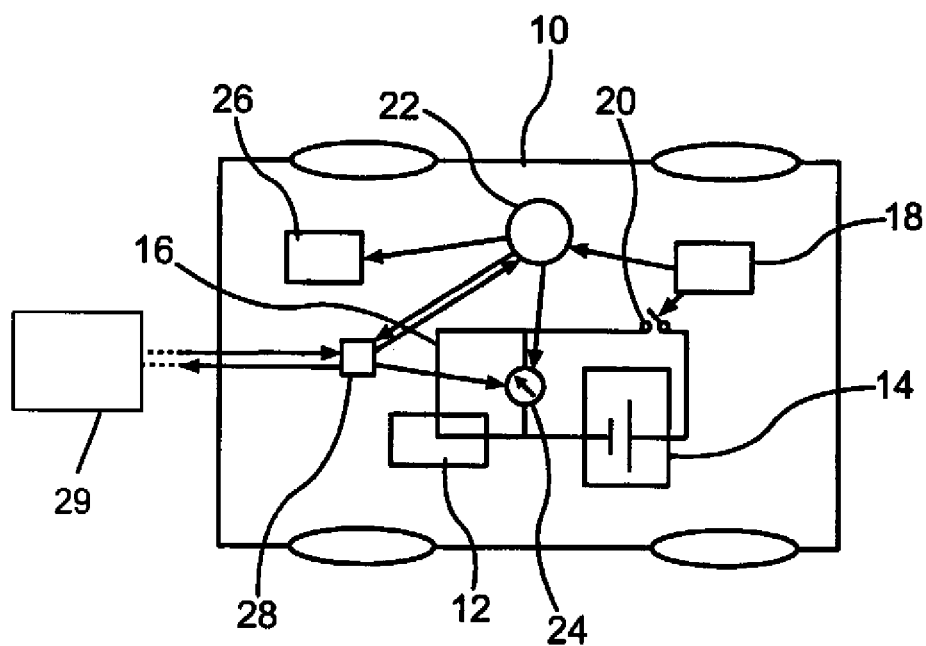
FIG. 2 shows schematically a vehicle with an electric circuit.

An electric vehicle 10 has an electric engine 12 which is supplied with electric power from a battery 14 in a circuit 16 (see FIG. 2). When maintenance work is to be performed, for example, on the electric engine 12, the circuit 16 must first be disconnected. To this end, a service technician requests with an operating unit 18, that a switching means 20 of the circuit is operated such that only a very small voltage or no voltage at all is measurable in the circuit 16. For example, the service technician can pull out the "Service Plug" of the electric vehicle (step S10, FIG. 1).

This actuation of the "Service Plug" is then also recognized by a control unit 22 of the electric vehicle 10. This may be, for example, a "Battery Management System", or an engine control unit of the electric vehicle 10. It is also conceivable that these two control units, and possibly also additional control units of the electric vehicle 10 at the same time recognize the actuation of the service plug and together take over the functions of the control unit 22.

The control unit 22 then controls a measuring unit 24, which measures the voltage applied to the circuit 16 (step S12, FIG. 1). Such measurement may be performed simultaneously at different locations in order to determine, for example, a malfunctioning measurement unit. A status of the main protection relay of the circuit 16 or an insulation of the circuit 16 may also be checked in a suitable manner concurrent with the voltage measurement.

The control unit 22 then compares the measured value for the voltage in the circuit 16 with predetermined values for the voltage (Step S14, FIG. 1). The predetermined values may, for example, be stored in a memory of the control unit 22. When a voltage in the circuit 16 is less than, for example, 20 Volt, and if the status of the main protection relay of the circuit 16 as well as the isolation of the circuit are also at a predetermined state, the control unit 22 causes the requested mode for the circuit 16 to be set (step S16, FIG. 1), for example by illuminating a light of a display unit 26 of the electric vehicle 10 indicating that.

The controller 22 may also cause the display unit 26 to display, whether the "service plug" was operated. The service technicians are then has already two pieces of information available, based on which he can estimate whether the maintenance work can now be performed safely.

The state of the current circuit 16 is additionally performed in parallel and independent of the steps S12 to S16. To this end, an additional control unit 29 disposed outside the electric vehicle 10 and configured, for example, in a conventional manner to perform "Guided Troubleshooting (GFS)" causes the measuring unit 24 of the electric vehicle 10 to perform additional independent voltage measurements. The status of the main relay as well as the isolation of the circuit 16 may also be checked again independently. This may be enabled by providing the electric vehicle 10 with communication means 28 having an interface for exchanging data between the control unit 29 outside of the electric vehicle and the control unit 22 and the measuring unit 24, respectively. Measured values for the voltage in the circuit 16 can be read out easily by the control unit 29 outside the electric vehicle 10.

This control unit then compares the additional independently measured values for the voltage in the circuit 16 with the predetermined values for the required state. When the circuit 16 has a voltage of, for example, less than 20 Volts, the control unit outside of the electric vehicle 10 also indicates that the requested mode for the power circuit 16 is set. The service technician thereby obtains a third item of information which allows to even better estimate the risk of accidents during maintenance work on the high-voltage system of the electric vehicle 10. This represents an easily verifiable, safe and cost-efficient test if maintenance work can be performed safely on the electric vehicle 10.

The invention claimed is:

1. A method for checking a state of a high-voltage electric circuit of a motor vehicle, wherein the motor vehicle is an electric vehicle or a hybrid vehicle, the method comprising the steps of:
   a) requesting a state for the electric circuit,
   b) measuring with at least one measuring device of the motor vehicle disposed in the motor vehicle a current value for at least one variable relating to the electric circuit, based on which the state of the electric circuit can be derived,
   c) checking with at least one control device of the motor vehicle whether the current value for the at least one variable corresponds to at least one predetermined value for the at least one variable for the requested state,
   d) when the current value for the at least one variable corresponds to the at least one predetermined value for the at least one variable for the requested state, indicating that the requested state of the electric circuit is set,
   in parallel with the steps b) though d), initiating and performing with at least one additional control device disposed outside the motor vehicle the following steps:
   e) performing with the at least one measuring device of the motor vehicle at least one additional measurement of another current value for the at least one variable relating to the electric circuit from which the state of the electric circuit can be derived, and communicating results of the at least one additional measurement to the at least one additional control device, f) performing an additional check with the at least one additional control device whether the current value of the at least one variable corresponds to at least one predetermined value the at least one variable, and g) performing an additional indication that the requested state of the electric circuit is set, when the current value for the at least one variable corresponds to the at least one predetermined value for the at least one variable for the requested state.

2. The method of claim 1, wherein the variable is a voltage in the electric circuit.

3. The method of claim 1, wherein it is indicated whether the state for the electric circuit was requested.

4. A motor vehicle embodied as an electric vehicle or a hybrid vehicle, comprising:
at least one electric circuit,
at least one measuring device disposed in the motor vehicle for measuring a quantity related to the electric circuit,
at least one operating device for requesting a state of the electric circuit, and
at least one control device which is configured to
receive from the measuring device at least one current value for the variable related to the electric circuit,
check whether the at least one current value corresponds to at least one predetermined value for the variable for the requested state,
indicate that the requested state for the electric circuit is set, when the at least one current value for the variable relating to the electric circuit corresponds to the at least one predetermined value for the variable of the electric circuit, the motor vehicle further comprising:
a communication interface for exchanging data with a control device disposed outside the motor vehicle, wherein the control device outside the motor vehicle is configured to
cause the at least one measuring device of the motor vehicle to measure at least one additional current value for the variable relating to the electric circuit,
check whether the at least one additional current value corresponds to at least one predetermined value for the variable for the requested state,
indicate that the requested state for the electric circuit is set, when the at least one additional current value for the variable relating to the electric circuit corresponds to the at least one predetermined value for the variable relating to the electric circuit.

5. The motor vehicle of claim 4, wherein the at least one control device comprises a memory for storing at least one of measurement values and the predetermined values for the variable.

6. The motor vehicle of claim 4, comprising an electric engine, wherein the electric circuit is associated with the electric engine.

* * * * *